(12) United States Patent
Yang et al.

(10) Patent No.: US 10,405,443 B1
(45) Date of Patent: Sep. 3, 2019

(54) ADAPTIVE OPENING FOR AN ELECTRONIC HARDWARE ENCLOSURE

(71) Applicant: LITEMAX ELECTRONICS INC., New Taipei (TW)

(72) Inventors: Tien-Teng Yang, New Taipei (TW); Ching-Yuan Lin, New Taipei (TW)

(73) Assignee: LITEMAX ELECTRONICS INC. (TW)

( * ) Notice: Subject to any disclaimer, the term of this patent is extended or adjusted under 35 U.S.C. 154(b) by 0 days.

(21) Appl. No.: 16/004,490

(22) Filed: Jun. 11, 2018

(51) Int. Cl.
| | |
|---|---|
| *G06F 1/16* | (2006.01) |
| *G06F 1/18* | (2006.01) |
| *H05K 5/00* | (2006.01) |
| *H05K 5/02* | (2006.01) |
| *H01R 12/72* | (2011.01) |
| *H01R 31/00* | (2006.01) |

(52) U.S. Cl.
CPC ......... *H05K 5/0239* (2013.01); *G06F 1/1658* (2013.01); *G06F 1/183* (2013.01); *H01R 12/722* (2013.01); *H01R 31/00* (2013.01); *H05K 5/0004* (2013.01); *H05K 5/0026* (2013.01); *H05K 5/0247* (2013.01)

(58) Field of Classification Search
CPC . H01R 13/447; H01R 13/4538; G06F 1/1601; G06F 1/1632; G06F 1/1658; G06F 1/1684; G06F 1/181; G06F 1/183; H05K 5/00; H05K 5/0004; H05K 5/0008; H05K 5/0247; H05K 5/0256; H05K 5/026; H05K 5/0282; H05K 7/14; H05K 7/1461
See application file for complete search history.

(56) References Cited

U.S. PATENT DOCUMENTS

| | | | | |
|---|---|---|---|---|
| 7,439,694 B2* | 10/2008 | Atlas | ......................... | A47B 9/04 108/146 |
| 7,540,748 B2* | 6/2009 | Tracy | .................... | G06F 1/1616 439/131 |
| 7,821,790 B2* | 10/2010 | Sharma | ................ | H05K 7/1424 361/725 |
| 8,614,890 B2* | 12/2013 | Hensley | ............... | H05K 5/0021 312/223.2 |

\* cited by examiner

*Primary Examiner* — Vanessa Girardi
(74) *Attorney, Agent, or Firm* — Schmeiser, Olsen & Watts, LLP

(57) ABSTRACT

A movable adaptive structure for external devices has a main body and a movable element. The main body has an adapting window, an adapting terminal and a stationary portion. The adapting window is disposed on one side of the main body. The adapting terminal is disposed in the main body. The adapting terminal corresponds in position to the adapting window and thus is in communication with the outside, to adapt to an external device. The stationary portion is positioned proximate to the adapting window. The movable element has at least two positioning portions spaced apart and moves relative to the adapting window such that any one of the positioning portions is positioned at the stationary portion to change area of the adapting window. Therefore, the adaptive structure operates flexibly enough to adapt to the external device of variable dimensions.

11 Claims, 4 Drawing Sheets

US 10,405,443 B1

ADAPTIVE OPENING FOR AN ELECTRONIC HARDWARE ENCLOSURE

TECHNICAL FIELD

The present disclosure relates to adaptive structures and, more particularly, to a movable adaptive structure for external devices, and the dimensions of the movable adaptive structure are adjustable to suit various devices in order to attain adaptive connection.

RELATED ART

An adaptive structure generally refers to a hardware structure whereby any type of electronic apparatus is connected to external devices (such as external hard disk drives and cables.) For instance, cases of personal computers are a model of integration of various adaptive structures, as their backs provide holes and slots whereby the motherboards of the personal computers are connected to peripherals, such as mouses, keyboards and monitors.

Owing to wide use of personal computers, peripherals of personal computers usually have their respective dedicated connection interfaces. The connection interfaces come with specifications, such as USB, 3.5-mm connectors, and P-CIE. The specifications are so highly standardized that incompatible issues between hardware and a connection interface are uncommon.

By contrast, the other electronic apparatuses are often incompatible with the aforesaid connection interfaces. In this regard, the incompatible issues are rendered intractable by coexisting specifications of connection interfaces. The specifications of connection interfaces end up in coexistence, because they are developed by manufacturing giants at will. The issues are further aggravated by monopoly and mounting needs for non-consumer, professional electronic apparatuses.

In the face of connection interfaces with different dimensions, downstream suppliers of adaptive structures have to develop suitable adaptive structures at the expense of cost efficiency in design, manufacturing, warehouse management, and marketing. Thanks to commercially-available adaptive structures with different dimensions, end users purchase only those apparatuses which are compatible with their respective adaptive structures. In some special circumstances, the aforesaid incompatible problems pertaining to connection interfaces remain unsolved, despite a full stock of adaptive structures.

SUMMARY OF THE DISCLOSURE

Considering that conventional adaptive structures adapt to external devices poorly, the present disclosure provides a movable adaptive structure for external devices. The movable adaptive structure for external devices includes positioning portions and a movable element operating in conjunction with each other to allow the adaptive structure to undergo adjustment of dimensions according to a connection interface and thus enhance its adaption to the external devices.

In an embodiment of the present disclosure, the movable adaptive structure for external devices includes a main body and a movable element. The main body includes an adapting window, an adapting terminal and a stationary portion. The adapting window is disposed on one side of the main body. The adapting terminal is disposed in the main body. The adapting terminal corresponds in position to the adapting window and thus is in communication with the outside, to adapt to an external device. The stationary portion is positioned proximate to the adapting window. The movable element includes at least two positioning portions spaced apart. The movable element moves relative to the adapting window such that any one of the positioning portions is positioned at the stationary portion to change area of the adapting window.

DETAILED DESCRIPTION OF THE PREFERRED EMBODIMENTS

Objectives, features, and advantages of the present disclosure are hereunder illustrated with specific embodiments in conjunction with the accompanying drawings and described below.

Figure 1:
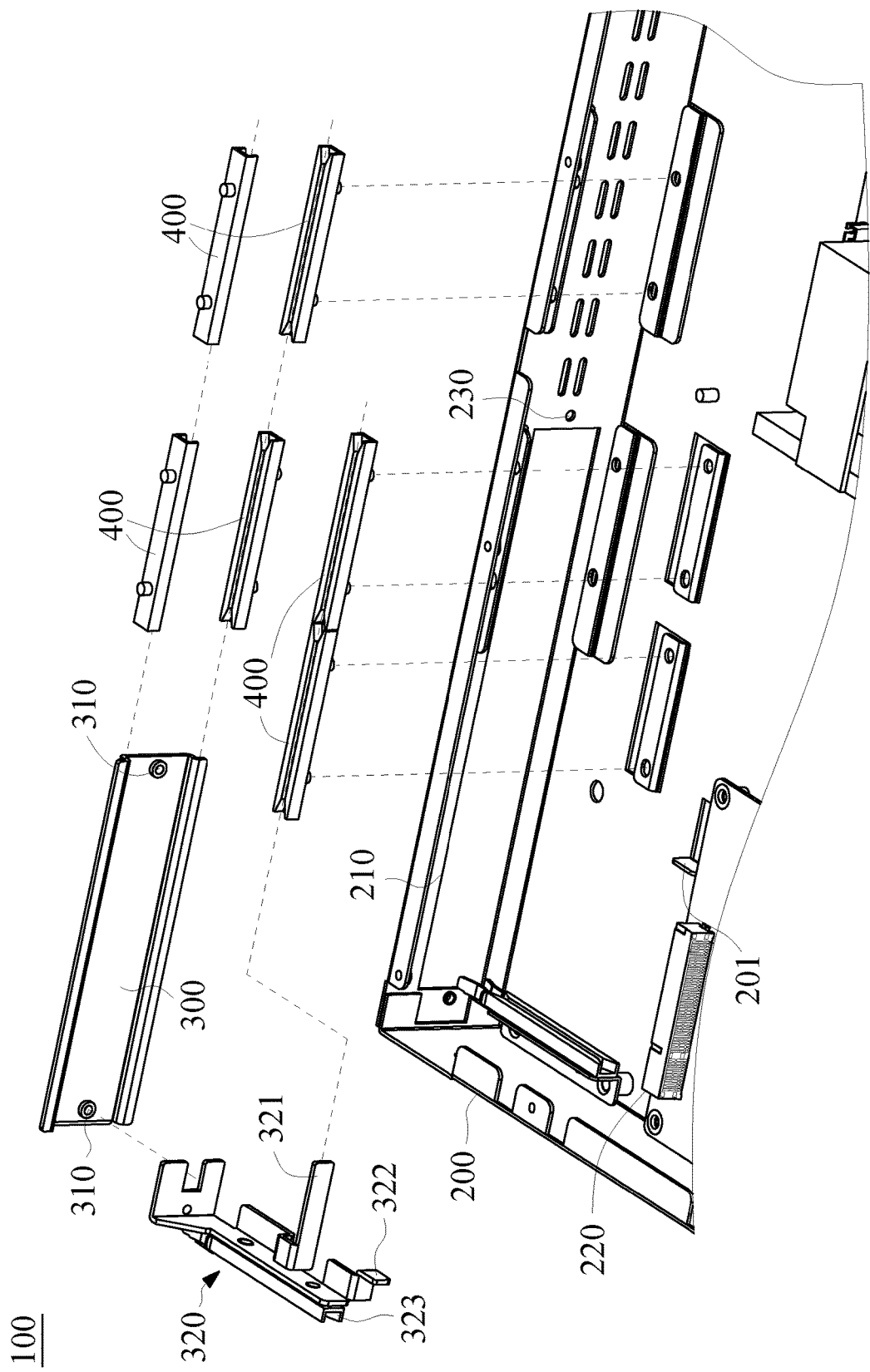
FIG. 1 is an exploded view of a movable adaptive structure for external devices according to an embodiment of the present disclosure.

Referring to FIG. 1, in an embodiment of the present disclosure, a movable adaptive structure 100 for external devices includes a main body 200 and a movable element 300. The main body 200 includes an adapting window 210, an adapting terminal 220 and a stationary portion 230. The adapting window 210 is hollowed out and disposed on one side of the main body 200. The adapting terminal 220 is disposed in the main body 200, corresponds in position to the adapting window 210 and thus is in communication with the outside. The stationary portion 230 is positioned proximate to the adapting window 210.

The main body 200 generally refers to the case of any apparatus, but the present disclosure is not limited thereto. In a variant embodiment, the main body 200 is a back board or truss which any other apparatus is mounted on, and the apparatus is a conventional electronic apparatus, such as a display unit, a computer, a player, a modem or a multi-function printer, but the present disclosure is not limited thereto.

The movable element 300 includes two positioning portions 310. The two positioning portions 310 are spaced apart. The movable element 300 moves relative to the adapting window 210 such that one of the two positioning portions 310 is positioned at the stationary portion 230 to change the area of the adapting window 210. In this embodiment, the positioning portions 310 are implemented by bolt holes or screw holes, and the stationary portion 230 corresponds in position to the positioning portions 310.

Figure 2:
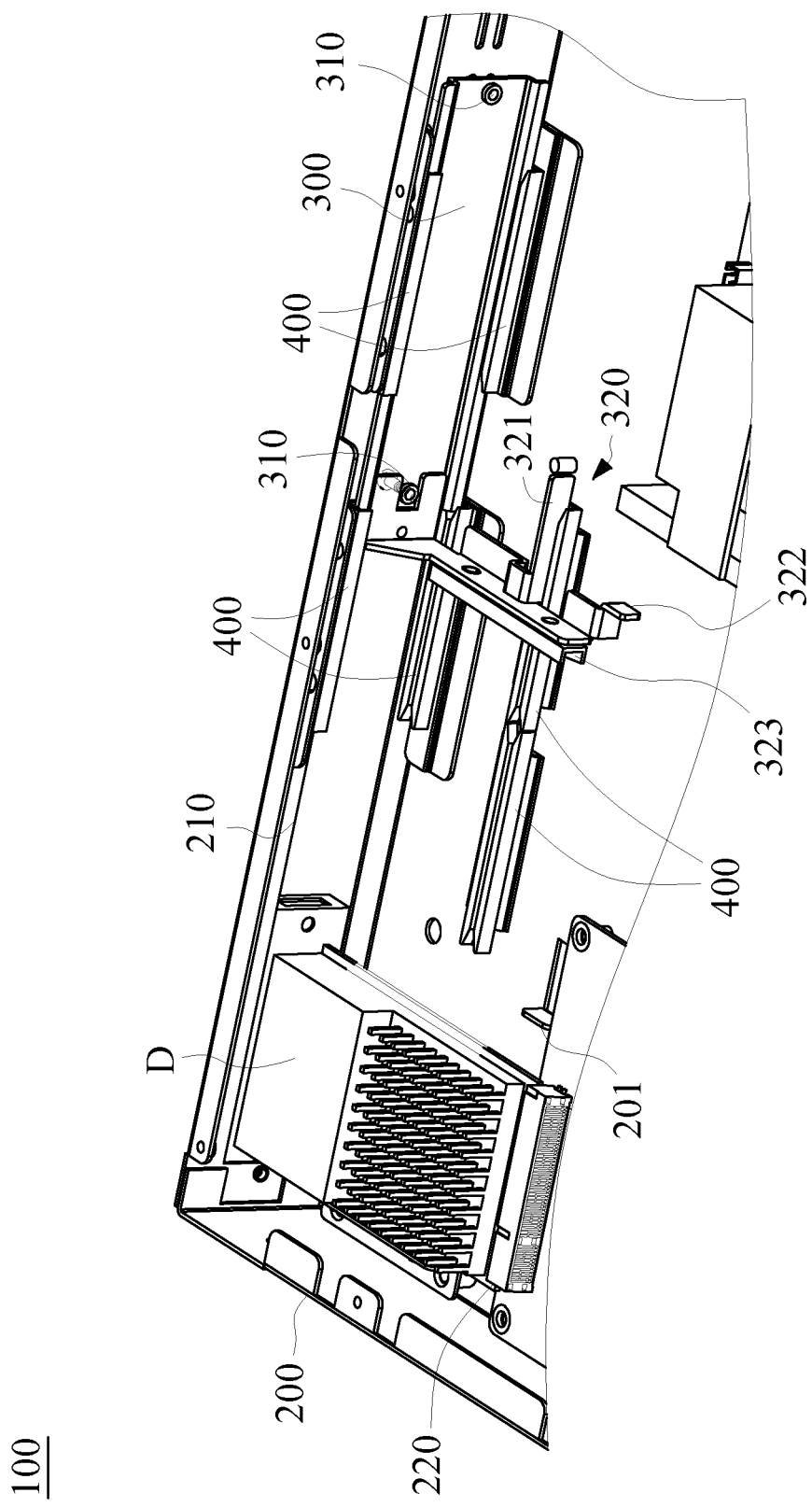
FIG. 2 is a schematic view of how to open a movable element of the movable adaptive structure for external devices according to an embodiment of the present disclosure.
Figure 3:
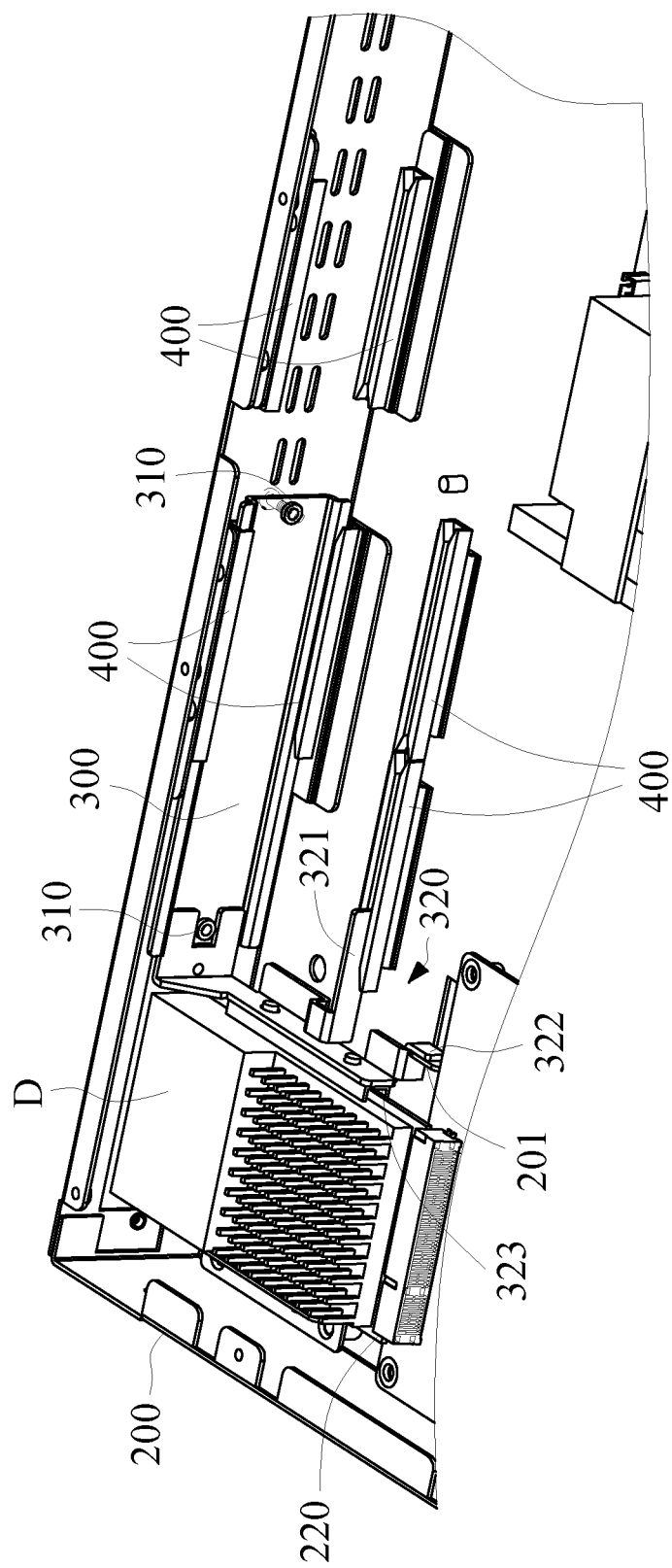
FIG. 3 is a schematic view of how to shut the movable element of the movable adaptive structure for external devices according to an embodiment of the present disclosure.

Referring to FIG. 2 and FIG. 3, the adapting terminal 220 is implemented by an IC circuit board, a plug or a socket and intended to adapt to an external device D, such as a USB flash drive, a signal source or any other program-controlled electronic carrier. As shown in FIG. 2, the external device D is inserted into the adapting window 210 and thus occupies a portion of the cross-sectional area thereof, whereas the movable element 300 slidingly moves relative to the adapting window 210, depending on the dimensions of the external device D, and thus the movable element 300 is fixed to the stationary portion 230 by the positioning portions 310.

The positioning portions 310 are in the number of three or more, such that the external device D which the movable element 300 adapts to is allowed to be of variable dimensions.

In the preceding embodiment, the movable element 300 is capable of being fixed in place at different positions to change the hollowed-out area of the adapting window 210 and thus adapts to the external device D of variable dimensions.

Figure 4:
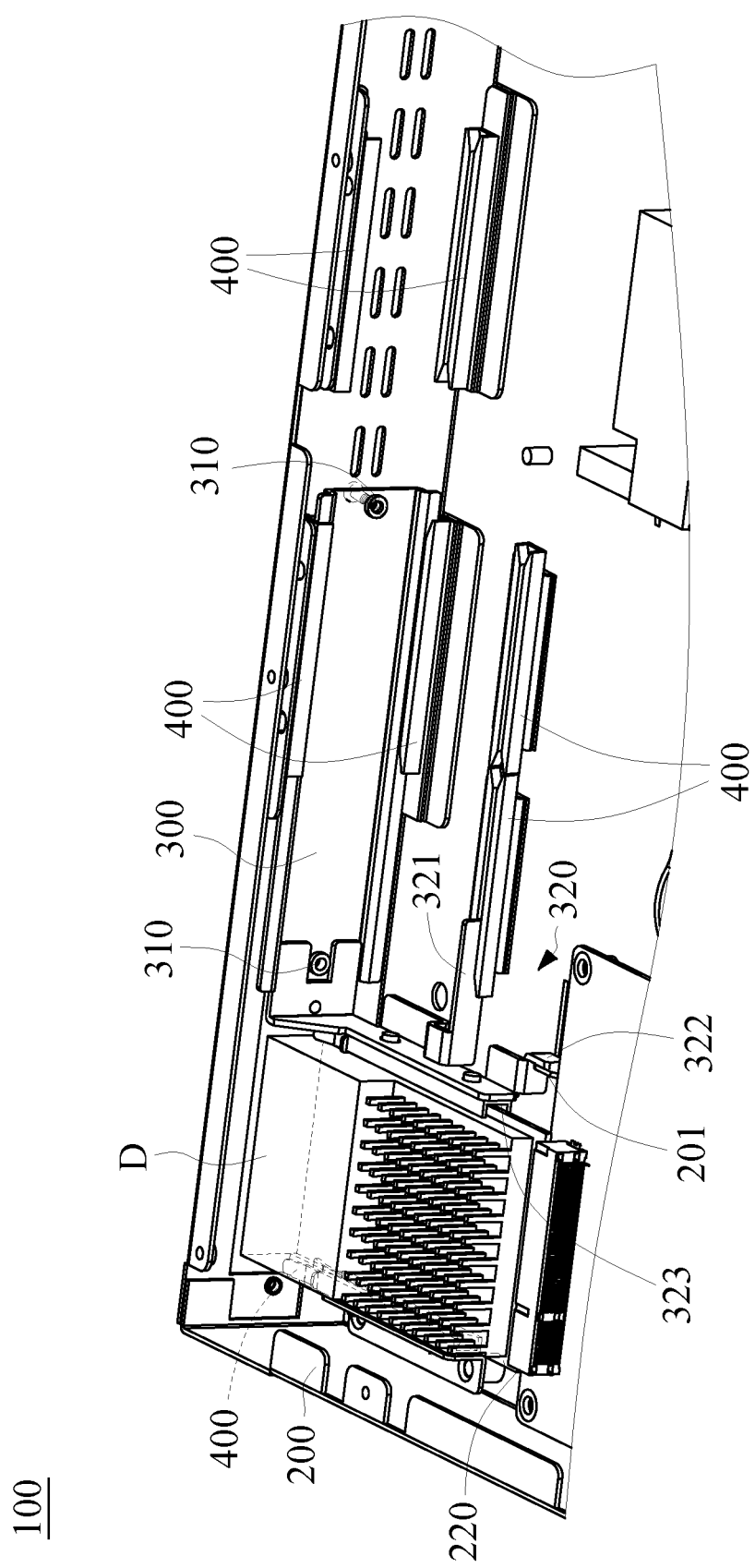
FIG. 4 is a schematic view of how guide elements of the movable adaptive structure for external devices perform a guiding function according to an embodiment of the present disclosure.

In an embodiment, the movable adaptive structure 100 for external devices includes a plurality of guide elements 400. The guide elements 400 are disposed on the main body 200 and correspond in position to the range of movement of the movable element 300 to guide the movement of the movable element 300. Referring to FIG. 2 and FIG. 3, the guide elements 400 are guide channels disposed on two sides of the movable element 300, respectively, to guide the movement of the movable element 300. In a variant embodiment, the guide elements 400 are guide rails, bumps or baffles and are disposed at any other positions other than the two sides of the movable element 300. As shown in FIG. 4, the guide elements 400 are disposed at the main body 200 and positioned proximate to the adapting window 210 to guide the entry of the external device D into the main body 200 and thus connect the external device D to the adapting terminal 220, thereby augmenting the guidance and support provided to the external device D.

To stabilize the movement of the movable element 300, the movable element 300 further includes a lateral board 320. The lateral board 320 has an auxiliary end 321. The auxiliary end 321 also moves under the guidance of the guide elements 400. In this embodiment, the movement of the movable element 300 is characterized by dual-track sliding and thus incapable of deviations.

Moreover, the main body 200 further includes a stop portion 201. The stop portion 201 is protrudingly disposed in the main body 200 and corresponds in position to the movable element 300. Referring to FIG. 3, the lateral board 320 further includes a stop plate 322. The stop portion 201 comes into contact with the stop plate 322 above the lateral board 320 of the movable element 300 as soon as the right one of the positioning portions 310 is positioned at the stationary portion 230; hence, not only does the stop portion 201 ensure that the positioning portions 310 align with the stationary portion 230 precisely, but the stop portion 201 also restricts the range of movement of the movable element 300 to therefore prevent the movable element 300 from hitting the external device D. Furthermore, as shown in FIG. 3, the lateral board 320 of the movable element 300 further includes a coupling portion 323. The coupling portion 323 is in contact with the external device D to assist with lateral fixation.

In the aforesaid embodiments of the present disclosure, an adaptive structure operates flexibly enough to adapt to an external device of variable dimensions. Furthermore, the adaptive structure offers manufacturers and users an effective solution to incompatible problems between hardware and a connection interface, as the positioning portions of the adaptive structure have simple configuration but no structural limitations.

The present disclosure is disclosed above by preferred embodiments. However, persons skilled in the art should understand that the preferred embodiments are illustrative of the present disclosure only, but shall not be interpreted as restrictive of the scope of the present disclosure. Hence, all equivalent modifications and replacements made to the aforesaid embodiments shall fall within the scope of the present disclosure. Accordingly, the legal protection for the present disclosure shall be defined by the appended claims.

What is claimed is:

1. A hardware structure for an electronic apparatus connected to external devices comprising;
    an adaptive window opening in a side of the hardware structure;
    a terminal disposed within the hardware structure which is accessible through the adaptive window opening;
    a moveable element, disposed along the side of the hardware structure, comprising;
        at least two, spaced apart, positioning portions whereupon moving the moveable element parallel to the adaptive window opening at least one of the positioning portions is secured at a stationary portion of the hardware structure such that sizing of the adaptive window opening is adjusted to that which is required by an external device while the moveable element occupies any remaining portion of the adaptive window opening.

2. The movable adaptive structure for external devices according to claim 1, wherein the two positioning portions are bolt holes or screw holes.

3. The movable adaptive structure for external devices according to claim 1, further comprising at least one guide element disposed on the main body and positioned proximate to the adapting window to guide connection of the external device to the adapting terminal.

4. The movable adaptive structure for external devices according to claim 1, wherein the adapting terminal is an IC circuit board, a plug or a socket.

5. The movable adaptive structure for external devices according to claim 1, wherein the main body further comprises a stop portion protrudingly disposed in the main body and corresponding in position to the movable element to come into contact with the movable element as soon as one of the positioning portions is positioned at the stationary portion.

6. The movable adaptive structure for external devices according to claim 1, wherein the movable element further comprises a coupling portion corresponding in position to the external device to come into contact with the external device as soon as one of the positioning portions is positioned at the stationary portion.

7. The movable adaptive structure for external devices according to claim 1, wherein the main body is a case for an apparatus.

8. The movable adaptive structure for external devices according to claim 7, wherein the apparatus is a display unit, a computer, a player, a modem or a multi-function printer.

9. The movable adaptive structure for external devices according to claim 1, further comprising at least one guide element disposed on the main body and corresponding in position to a range of movement of the movable element to guide the movement of the movable element.

10. The movable adaptive structure for external devices according to claim 9, wherein the guide element is in number of two or more, and the two guide elements are disposed on two opposing sides of the movable element, respectively.

11. The movable adaptive structure for external devices according to claim 9, wherein the guide element is a guide channel, a guide rail, a bump or a baffle.

\* \* \* \* \*